United States Patent [19]

Logan et al.

[11] Patent Number: 4,541,677
[45] Date of Patent: Sep. 17, 1985

[54] CONTINUOUS STRIP OF JUMPER CABLE ASSEMBLIES

[75] Inventors: Thomas D. Logan, Concord; David A. Wedell, Winston-Salem, both of N.C.

[73] Assignee: AMP Incorporated, Harrisburg, Pa.

[21] Appl. No.: 638,835

[22] Filed: Aug. 7, 1984

Related U.S. Application Data

[63] Continuation of Ser. No. 477,997, Mar. 23, 1983, abandoned.

[51] Int. Cl.⁴ .............................................. A01R 11/00
[52] U.S. Cl. .................................... 339/17 F; 29/866; 29/867; 339/29 R; 339/276 SF
[58] Field of Search ................ 29/857, 861, 863, 866, 29/867; 339/17 F, 28, 29 R, 29 B, 59 R, 59 M, 97 C, 276 SF

[56] References Cited

U.S. PATENT DOCUMENTS

| | | | |
|---|---|---|---|
| 3,553,836 | 1/1971 | Cootes | 29/866 |
| 3,727,168 | 4/1973 | Henschen et al. | 339/17 F |
| 4,082,402 | 4/1978 | Kinkaid | 339/97 C |
| 4,085,502 | 4/1978 | Ostman et al. | 29/629 |
| 4,113,335 | 9/1978 | Laug et al. | 339/29 R |
| 4,290,179 | 9/1981 | Bakermans et al. | 29/743 |
| 4,357,750 | 11/1982 | Ostman | 29/847 |

FOREIGN PATENT DOCUMENTS 2096818A  3/1982  United Kingdom .

Primary Examiner—Gil Weidenfeld
Assistant Examiner—Gary F. Paumen
Attorney, Agent, or Firm—Katherine A. Nelson

[57] ABSTRACT

A continuous strip of serially interconnected and individually separable jumper cable assemblies and a method for making the same are disclosed. The strip is comprised of cable having a plurality of insulated conductors therein, the cable further having a plurality of spaced apart lines of perforations defining junctions between the jumper cable assemblies and relatively short intervening segments of cable between the end of one and the beginning of another jumper cable assembly. Rows of oppositely facing connecting means are attached to the cable adjacent the perforation lines so that the mating portions of the first and second connecting means are located essentially above the intervening segments. The rows of first and second connecting means need not necessarily be identical. Individual jumper cable assemblies are removed from the strip by severing the cable along the perforation lines and removing the intervening portion of cable.

16 Claims, 5 Drawing Figures

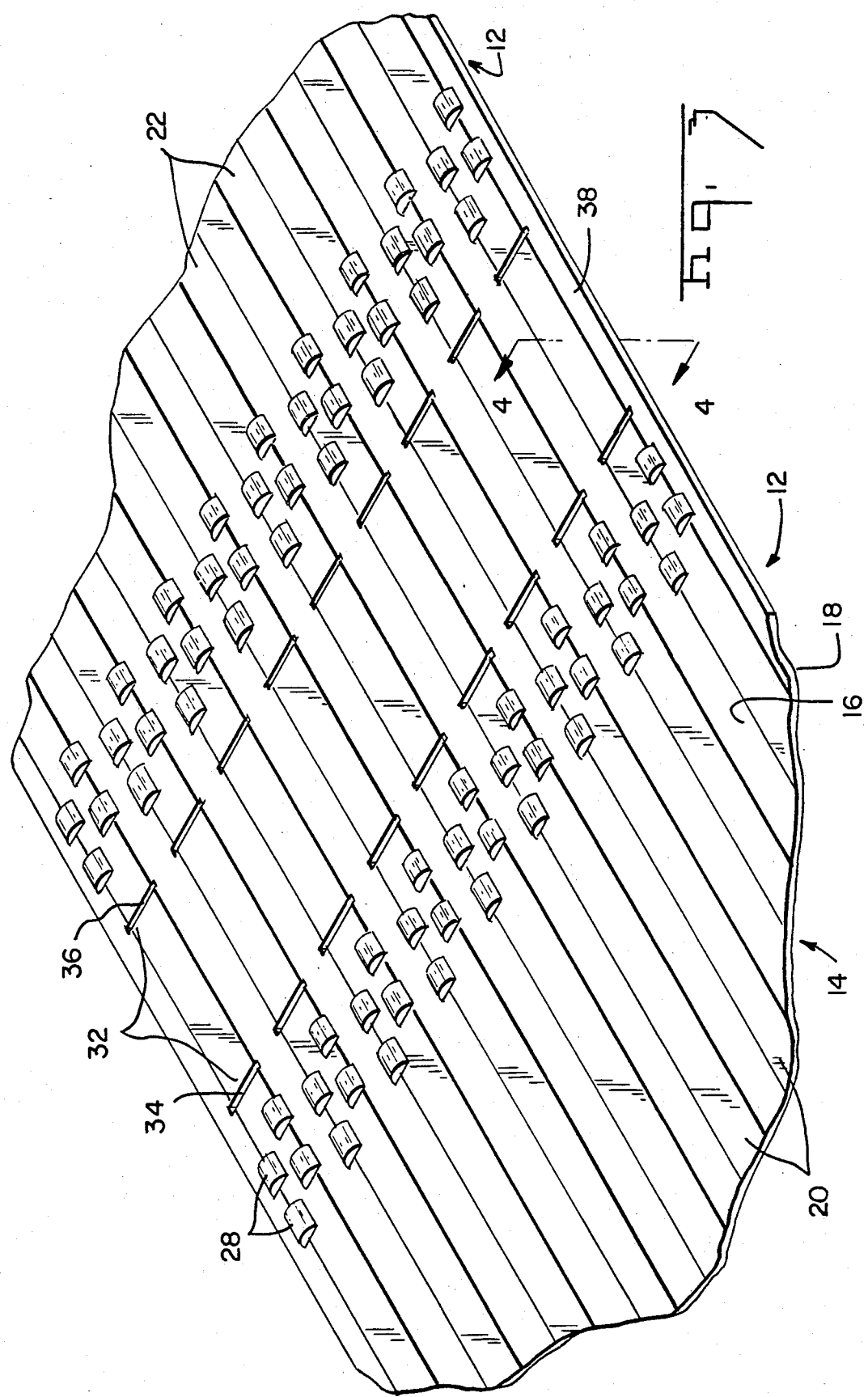

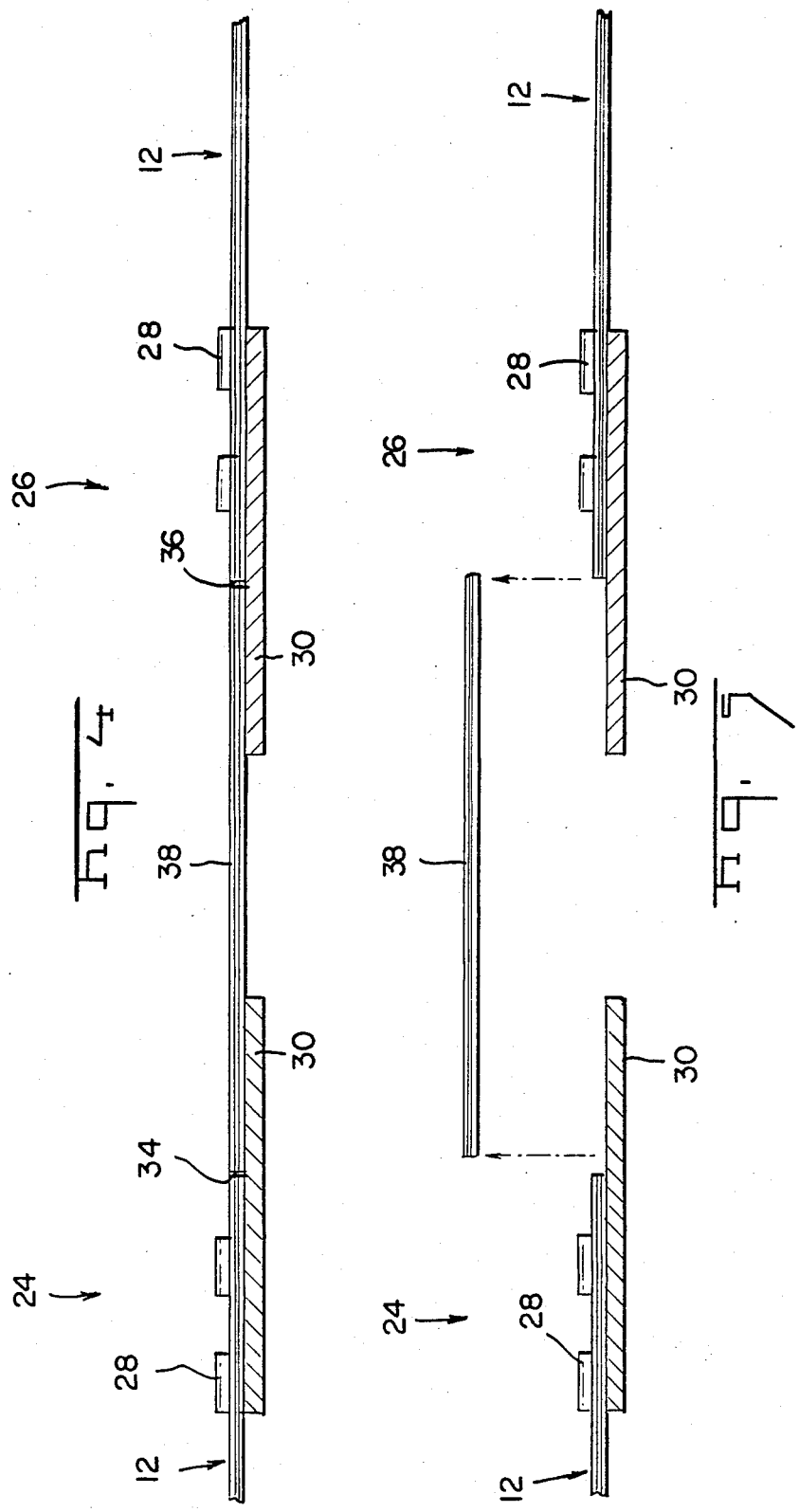

CONTINUOUS STRIP OF JUMPER CABLE ASSEMBLIES

This is a continuation of application Ser. No. 477,997, filed Mar. 23, 1983, now abandoned.

FIELD OF THE INVENTION

This invention relates to multiple conductor jumper cables and a method for manufacturing the same.

BACKGROUND OF THE INVENTION

Jumper cable assemblies made from flat conductor cable are widely used by industry in electronic equipment primarily to interconnect printed circuit boards.

Heretofore, jumper cable assemblies have been made on a piece-by-piece basis by methods such as cutting cable to the desired length and then terminating the ends of the cut cable or by laminating flexible films to conductors having formed terminal ends.

A typical jumper cable assembly is comprised of a length of cable having a plurality of insulated electrical conductors therein with each conductor having first and second connecting means attached to and extending outwardly from respective ends thereof. Each connecting means has an attaching portion, an intermediate portion and a mating portion. The first and second connecting means need not necessarily be identical.

The present invention is directed toward making a continuous strip of separable jumper cable assemblies which can be rolled on a reel for both storage and shipping to a customer. The customer can separate the assemblies and apply them individually or use the strip for automated processes.

The strip of serially interconnected and individually separable jumper cable assemblies is comprised of said assemblies and relatively short intervening segments therebetween. Each assembly is comprised of a predetermined length of cable, said cable having at least one elongated insulated electrical conductor therein, said conductor having a first and second connecting means attached to and extending outwardly from respective ends thereof. Lines of perforations define junctions between said jumper cable assemblies and said intervening segments. The lines of perforations are disposed adjacent to said first and second connecting means. Upon removal of said intervening segments to effect separation of said jumper cable assemblies from said strip, said first and second connecting means are readily accessible for electrical interconnection in a desired circuit.

The cable in the preferred embodiment is a ribbon-like cable having a plurality of parallel elongated conductors insulated by flat ribbon-like insulating material. The perforation lines traverse the strip in a direction essentially normal to the direction of the conductors. Owing to the difference in length of the jumper cable assembly and the intervening segment, the pair of perforation lines defining the length of the intervening segment are closer together than those defining the predetermined length of jumper cable assembly.

A plurality of spaced apart connecting means are attached to each conductor. The connecting means, having an attaching portion, an intermediate portion, and a mating portion, are attached to the cable in rows adjacent and essentially parallel to the perforation lines. The perforation lines can be located above the mating, intermediate, or attaching portions of the connecting means. The mating portions of the connecting means along one of each pair of perforation lines that define the intervening segment face the mating portions along the second of each pair of those perforation lines and essentially lie above the intervening segment. Individual jumper assemblies can be removed from the strip by severing the cable along the perforation lines and removing intervening portions.

DESCRIPTION OF THE DRAWINGS

FIG. 3 is a fragmentary view of the upper surface of the cable illustrating a pair of perforation lines separating adjacent jumper assemblies.

FIG. 4 is a cross sectional side view taken along lines 4—4 of FIG. 3.

FIG. 5 is a cross sectional side view similar to FIG. 4 with the separable section of cable removed between two adjacent jumper assemblies.

Referring now to FIGS. 1, 2, and 3, cable 14 from a reel 50 and strips of first and second connecting means 46, 46' from reels 52 and 52' are fed into an apparatus 54 which attaches rows 24 and 26 of first and second connecting means 46, 46' and punches rows 34 and 36 of perforation lines across the cable thus forming adjacent jumper assemblies 12 and intervening segments 38 which are fed onto the reel 56.

Referring now to FIGS. 2 and 3, the cable 14 is a flat ribbon-like cable having an upper surface 16 and an under surface 18. Cable 14 is comprised of a plurality of conductors 20 insulated by flat ribbon-like insulating material 22. Pairs 32 of perforation lines defining the intervening segment are punched into the upper surface 16 of the cable 14. The lines of perforation sever substantially all of the conductors but not all of the insulating material. The pairs 32 of perforation lines are separated from each other by the predetermined jumper cable assembly length 40, the first perforation line 34 defining the junction of the end of one jumper assembly 12 and intervening segment 38 and the second perforation line 36 defining the junction at the beginning of the adjacent jumper assembly 12 and the next intervening segment 38. The pairs 32 of perforation lines 34, 36 traverse the cable 14 in a direction essentially normal to that of the conductors 20. The intervening portions 38 of cable between lines 34 and 36 lie essentially above the connecting means.

As illustrated in FIG. 2, rows 24 and 26 of oppositely facing connecting means 46,46' are attached to the cable proximate to the perforation lines 34, 36. It is to be understood that the first and second connecting means need not be the same. Identical connecting means are shown here for illustrative purposes only. The connecting means 46, 46' have an attaching portion 28, an intermediate portion 29 and a mating portion 30. The mating portion of the first row 24 of connecting means face the mating portion of the second row 26 of connecting means. These mating portions extend over the first and second perforation lines 34 and 36 and intervening segment 38 in the finished jumper cable assembly strip 10. It is to be understood that the connecting means may be attached to the cable so that the lines of perforation lie beneath any of the three portions of the connecting means, depending primarily upon the geometry of the connecting means used. The mating portions 30 of the first and second connecting means 46, 46' appear on the under surface 18 of the cable 14. FIG. 3 shows the attaching portions 28 of the first and second connecting means 46, 46' which appear on the upper surface 16 of the cable 14.

Figure 1:
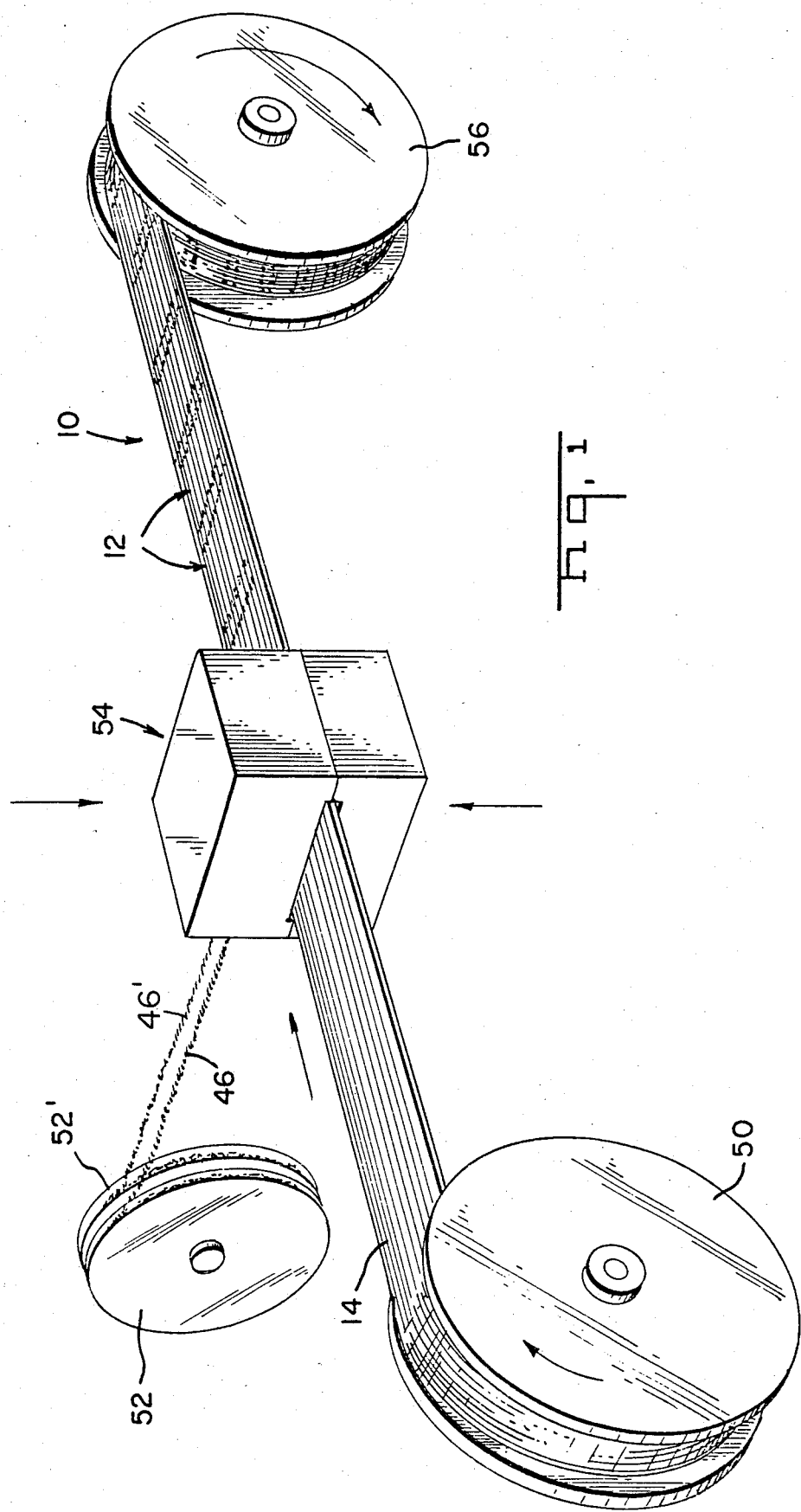
FIG. 1 is a three dimensional view representing the process for making the continuous strip of jumper cable assemblies.
Figure 2:
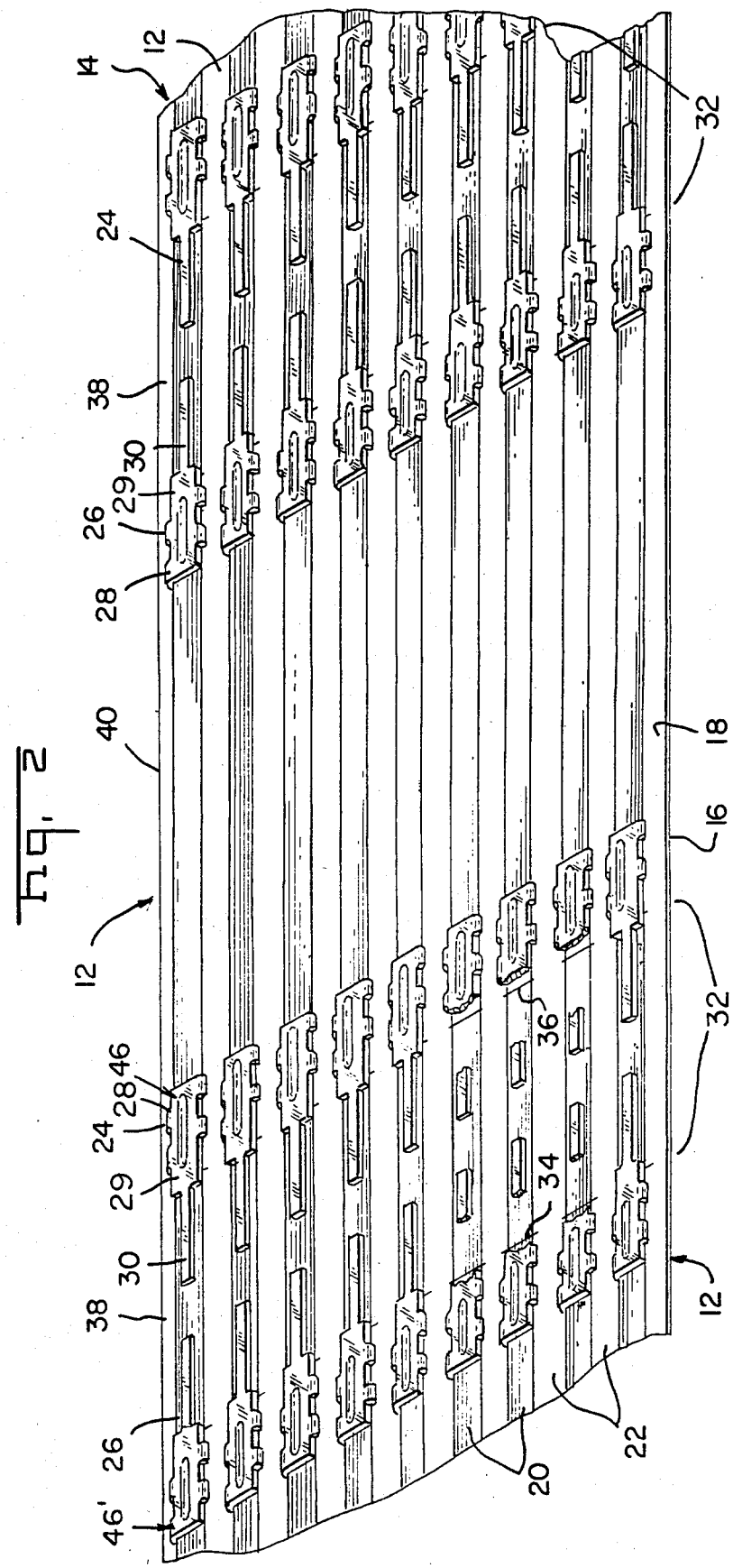
FIG. 2 is a three dimensional fragmentary view showing the under surface of the cable with the connector means on adjacent jumper cable assemblies.

As is illustrated in FIGS. 4 and 5, the jumper cable assembly units 12 and 12' are separated from each other by removing the severable intervening portion 38 of the cable between the closely spaced apart parallel perforation lines 34 and 36. Removal of this portion 38 exposes the mating portions 30 of the first and second rows 24, 26 of connecting means 46, 46' thus creating individual jumper assembly units.

A variety of types of connecting means can be attached to the cable according to the method disclosed herein. The present invention is particularly suited to crimpable connecting means having an attaching portion of the type disclosed in U.S. Pat. No. 4,082,402. These terminals can be crimped to the cables using machines such as those disclosed in U.S. Pat. Nos. 3,553,836 and 4,290,179.

Jumper cable assemblies of any desired length can be made by using the method disclosed herein. All that is needed is an indexing system, as is known in the art, to measure the desired length of cable between the subsequent pairs of parallel perforation lines. The distance between the two lines in each pair of perforation lines and the size of the intervening segments are determined by the length and shape of the mating portion of the connecting means being attached to the cable. The severable intervening portion needs to be sufficiently wide to enable the mating portions of connectors attached along each pair of parallel perforation lines to face each other, yet be essentially completely exposed once the severable intervening portion has been removed.

The strips of jumper cable assemblies can be stored on reels. The diameter of the reels should be of a sufficient size to prevent any distortion in the shape of the connecting means attached to the jumper cable assemblies. Jumper cable assemblies can be furnished to customers as individual assemblies and in strip form.

It is thought that the strip of interconnected jumper cable assemblies of the present invention and many of its attendant advantages will be understood from the foregoing description. It will be apparent that various changes may be made in the form, construction and arrangement of the parts thereof without departing from the spirit or scope of the invention or sacrificing all its material advantages. The form herein described is merely a preferred or exemplary embodiment thereof.

What is claimed is:

1. A continuous strip of jumper cable assemblies, each assembly being comprised of a length of cable having a plurality of insulated electrical conductors therein, with each conductor having a first end with a first connecting means thereon, an intermediate portion and a second end with a second connecting means thereon, each connecting means having an attaching portion and a mating portion, the strip being characterized in that:

the cable has a plurality of closely spaced apart parallel pairs of perforation lines, each pair of perforation lines being separated from the next pair of lines by the desired jumper cable length, the perforation lines traverse the strip in a direction essentially normal to that of the conductors, each pair of perforation lines marking the end of one and the beginning of another jumper cable assembly, the strip further has a plurality of spaced apart connecting means attached to each conductor, the connecting means being attached to the cable in essentially parallel lines proximate to the perforation lines so that the perforation lines are above the mating portions of the connecting means and the mating portions of the connecting means along one of each pair of perforation lines face the mating portions of the connector means along the second of each pair of perforation lines whereby, the individual jumper assemblies can be removed from the strip by severing the cable along the pairs of perforation lines beneath the mating portions of the connecting means.

2. A strip of serially interconnected and individually separable jumper cable assemblies, each assembly being comprised of a predetermined length of cable, said cable having at least one elongated insulated electrical conductor therein, said conductor having a first and second connecting means attached to and extending outwardly from respective ends thereof, said strip being characterized in that:

said strip is comprised of said jumper cable assemblies and relatively short intervening segments therebetween;

lines of perforations define junctions between said jumper cable assemblies and said intervening segments;

said lines of perforations are disposed adjacent to said first and second connecting means whereby, upon removal of said intervening segments to effect separation of said jumper cable assemblies from said strip, said first and second connecting means are readily accessible for electrical interconnection in a desired circuit.

3. A strip of serially interconnected and individually separable jumper cable assemblies according to claim 2 wherein each said first and second connecting means is comprised of an attaching portion for engaging an electrical conductor of the cable, an intermediate portion and a mating portion, said intermediate portion extending between said attaching and mating portions.

4. A strip of serially interconnected and individually separable jumper cable assemblies according to claim 3 wherein said lines of perforation which are disposed adjacent said first and second connecting means extend transversely across said attaching portions of said first and second connecting means.

5. A strip of serially interconnected and individually separable jumper cable assemblies according to claim 3 wherein said lines of perforation which are disposed adjacent said first and second connecting means extend transversely across said intermediate portions of said first and second connecting means.

6. A strip of serially interconnected and individually separable jumper cable assemblies according to claim 3 wherein said lines of perforation which are disposed adjacent said first and second connecting means extend transversely across said connecting portions of said first and second connecting means.

7. A strip of serially interconnected and individually separable jumper cable assemblies according to claim 2 wherein the lines of perforations sever at least substantially all of said at least one conductor.

8. A strip of serially interconnected and individually separable jumper cable assemblies according to claim 4 wherein the lines of perforations sever at least substantially all of said at least one conductor.

9. A strip of serially interconnected and individually separable jumper cable assemblies according to claim 5 wherein the lines of perforations sever at least substantially all of said at least one conductor.

10. A strip of serially interconnected and individually separable jumper cable assemblies according to claim 6 wherein the lines of perforations sever at least substantially all of said at least one conductor.

11. A strip of serially interconnected and individually separable jumper cable assemblies according to claim 2 wherein said cable is a flat ribbon-like cable comprised of a plurality of parallel elongated conductors insulated by flat ribbon-like insulating material.

12. A strip of serially interconnected and individually separable jumper cable assemblies according to claim 2 wherein the strip is in the form of a convolute roll.

13. A strip of serially interconnected and individually separable jumper cable assemblies according to claim 2 wherein said first and second connecting means are identical.

14. A method for making a strip of serially interconnected and individually separable jumper cable assemblies, each assembly being comprised of a predetermined length of cable, said cable having at least one elongated insulated electrical conductor therein, said conductor having a first and second connecting means attached to and extending outwardly from respective ends thereof, the method being comprised of the steps of:

perforating the cable with a plurality of spaced apart perforation lines, the perforation lines defining junctions between said jumper cable assemblies and relatively short intervening segments of cable;

attaching a plurality of spaced apart said first and second connecting means to said at least one conductor, said first and second connecting means being attached to the cable in rows proximate to the perforation lines so that the mating portions of the first and second connecting means along each pair of perforation lines that define intervening segments face each other and essentially lie above the intervening segment whereby, upon removal of said intervening segments to effect separation of said jumper cable assemblies from said strip, said first and second connecting means are readily accessible for interconnection in a desired circuit.

15. A method for making a strip of serially interconnected and individually separable jumper cable assemblies according to claim 14 wherein the cable is a flat ribbon-like cable comprising a plurality of conductors insulated by flat ribbon-like insulating material.

16. A method for making a strip of serially interconnected and individually separable jumper cable assemblies according to claim 14 further comprising the step of rolling the strip on a reel.

* * * * *